United States Patent [19]

Mueller et al.

[11] Patent Number: 4,733,342
[45] Date of Patent: Mar. 22, 1988

[54] POWER SUPPLY FOR AN INDUCTIVE USER, PARTICULARLY A GRADIENT COIL

[75] Inventors: Albert Mueller; Ingemar Neuffer, both of Erlangen, Fed. Rep. of Germany

[73] Assignee: Siemens Aktiengesellschaft, Berlin and Munich, Fed. Rep. of Germany

[21] Appl. No.: 57,326

[22] Filed: Jun. 4, 1987

[30] Foreign Application Priority Data

Jun. 30, 1986 [DE] Fed. Rep. of Germany ....... 3621889

[51] Int. Cl.⁴ ............................................. H02M 7/538
[52] U.S. Cl. .................................... 363/132; 361/152; 307/268; 324/322
[58] Field of Search ........................... 363/43, 98, 132; 361/152, 153, 154, 156; 307/262, 263, 264, 268; 324/309, 322

[56] References Cited

U.S. PATENT DOCUMENTS

| | | | |
|---|---|---|---|
| 3,473,040 | 10/1969 | Cominassi et al. | 363/132 |
| 4,203,151 | 5/1980 | Baker | 363/132 |
| 4,208,711 | 6/1980 | Baker | 363/43 |
| 4,238,820 | 12/1980 | Naaijer | 363/43 |
| 4,410,926 | 10/1983 | Hafner et al. | 361/93 |
| 4,470,095 | 9/1984 | Dönig | 361/154 |

FOREIGN PATENT DOCUMENTS 2084827 4/1982 United Kingdom.
2095940 10/1982 United Kingdom.

Primary Examiner—Patrick R. Salce
Assistant Examiner—Judson H. Jones
Attorney, Agent, or Firm—Hill, Van Santen, Steadman & Simpson

[57] ABSTRACT

Exactly defined current pulses having high edge steepness and high final value are required for the pulse-like generation of high magnetic fields in inductive users. Particularly in nuclear magnetic resonance tomography, such pulses serve the purpose of building up a topically variable magnetic field with an optimally linear field strength gradient. A power supply for generating such current pulses includes a series connection of a stepping voltage switch and a variable voltage source, whose resultant output voltage is applied to the inductive by a voltage commutator user with a suitable operational sign for the build-up or dismantling of the individual pulses. A switching and regulating circuit controls the stepping switch, the variable voltage source and the voltage commutator dependent on prescribed rated curves of the pulses, such that the pulses have a rise and decay time independent of the final value.

16 Claims, 4 Drawing Figures

POWER SUPPLY FOR AN INDUCTIVE USER, PARTICULARLY A GRADIENT COIL

BACKGROUND OF THE INVENTION

1. Field of the Invention

The invention is directed to an apparatus for generating brief current pulses with high edge steepness and high final value for inductive users, particularly for gradient coils for nuclear magnetic resonance tomography, whereby a high user voltage is applied for fast build-up of a pulse and a low user voltage is applied for the maintenance thereof.

2. Description of the Prior Art

Particularly in imaging methods in medical diagnostics, magnetic fields, in which a patient is disposed, that are topically variable in all three spatial directions are super-imposed on a constant fundamental magnetic field and a radio-frequency alternating field, for three-dimensional resolution of the nuclear magnetic resonance signal picked up from the examination subject. These topically variable magnetic fields are also referred to as gradient fields and have a magnetic field strength that increases as linearly as possible in the respective direction. They are a prerequisite for the reconstruction of a subject image and are preferably generated by radio-frequency pulsing gradient coils, resulting in high demands made of the power supplies required for feed of the gradient coils. Such supplies must generate pulse-like currents having final values of several 100 A with rise times that lie in the millisecond range.

Known arrangements of this type are composed, for example, of four power transistors arranged in a bridge, having a shunt arm in which the inductive user is connected. In one embodiment, these transistors are operated as a linear governor or regulator having a range of adjustment of about half the overall supply voltage. The large losses thereby resulting are further increased because, due to the low current loadability, each of the four power transistors of the bridge is composed of about 60 real transistors. In another embodiment, the transistors are driven by a radio-frequency, pulse-shaped signal, so that the behavior of this power supply corresponds to that of a switched power pack. A disadvantage of this embodiment, however, is a user current relatively rich in upper harmonics.

German OS No. 31 12 280 discloses a further apparatus of this type wherein a high, constant voltage is first applied to the inductive user for the build-up of a pulse-shaped current having an arbitrary operational sign. After a desired pulse height is reached, a switch to a lower supply voltage is undertaken, this being adequate for the maintenance thereof, and the strength of current is kept constant by a regulating means by varying the voltage acting on the user. Free-running circuits serve the purposes of dismantling the respective curreint pulse, these free-running circuits being in part closed by engaging additional electronic rectifiers and, under certain conditions, enabling feedback of the energy contained in the inductive user into one of the two voltage sources.

SUMMARY OF THE INVENTION

An object of the present invention is to provide an apparatus for highly exact and low-loss generation of exactly defined current pulses, particularly having a prescribed, large edge steepness and high final value, for the feed of inductive users, which can be realized with justifiable economic outlay. The required current pulses may follow one another irregularly and may have different final values. Further, a constant rise or decay time which is independent of the respective final value can be prescribed for the current pulses.

The object of the invention is achieved by an apparatus which includes a stepping switch for presetting the amount of the respective user voltage, a variable voltage source in series with the stepping switch and user for fine adjustment of the amount of the user voltage, a voltage commutator by means of which the respective user voltage is applied such that, dependent on its operational sign to the user, the individual current pulses are quickly built up or dismantled, and a switch and regulator means which drives the stepping switch, the controllable voltage source and the voltage commutator dependent on the final value, the edge steepness and the operational sign of the pulses. The stepping switch may consist of groups of identical voltage sources arranged in series and a switch network connected thereto.

A control and regulation means is preferably composed of a line or "end-to-end" model which, in accord with the load resistance $R_V$ and the load inductance $L_V$, exerts anticipatory control on the rated value $U_V^*$ of the user voltage from the prescribed form $i_V^*$ (t0 of the respective current pulse in accord with the equation $$U_V^* = R_V \cdot i_V^*(t) + L_V \cdot \frac{di_V^*(t)}{dt}.$$

The control and regulation means also contains an analog-to-digital converter which converts the rated value of the user voltage into a binary number, and a decoder which drives the stepping switch in accord with the magnitude of the binary number for presetting the user voltage, and drives the voltage commutator in accord with the operational sign of the binary number for directional application of the user voltage. The control and regulating means preferably contains a voltage control which drives the variable voltage source dependent on the difference between the output voltage of the stepping switch and the magnitude of the rated value of the user voltage, and dependent on the deviation of this voltage difference from the output voltage of the variable voltage source.

It is especially advantageous if an additional current regulator in the control and regulating means forms a correction signal from the actuation signal of actual and rated user current and locks this onto the rated value of the user voltage. A further pulse generator may be preferably employed wherein final values, rise and decay points in time of the current pulses are prescribed. This may be a standardized cumulative generator having a variable integration time which is started at every pulse rise or decay and, after multiplication of the output and input integration quantities by the respective final values, the rated curve of the individual current pulses and their derivations are output as characteristic quantities. The cumulative generator contains an integrator with negative feedback driven by a comparator. An additional means for eddy current compensation is preferably composed of a number of parallel transfer elements having differentiating-delaying behavior, this number being dependent on the time constants of the eddy current to be taken into consideration. These lock an output sum signal which is dependent on the rated curve of the respective current pulse onto the actuating signal of the user current regulator. It is also especially advantageous when the switch and control means contains a means for mains compensation. In such a compensation means, a binary counter is deincremented or incremented and the content thereof is added to the binary number when a maximum or minimum value of the rated value of the voltage control is upwardly or downwardly passed. Finally, a value formed in a rated value generator as compensation for the influence of shim coils attached to the inductive user is locked onto the actuating signal of the user current regulator.

The voltage commutator of the apparatus of the invention is preferably composed of four switches arranged in the form of a bridge, whereby the user is arranged in the shunt arm thereof. Each of the four switches is thereby preferably composed of a switching transistor with an opposite polarity, free-running diode connected in parallel therewith.

The voltage values of the groups of identical voltage sources of the stepping switch are graduated such that the voltage value of every source of a following group corresponds to the sum of all voltage values of this group, increased by the voltage value of a source of the preceding group. Preferably the lowest significance of the binary number corresponds to the lowest voltage prescribable by the stepping switch, and the maximum voltage prescribable at the variable voltage source corresponds to the lowest voltage prescribable by the stepping switch. The variable voltge source is composed of a diode bridge, with a transistor having a linearly modulatable collector-emitter voltage arranged in the shunt arm.

The switches of the stepping switch are preferably two oppositely connected transistors each having a series diode arranged in the collector-emitter direction. A protective diode may be arranged in its high-resistance direction at the output of the stepping switch.

DESCRIPTION OF THE PREFERRED EMBODIMENTS

Figure 1:
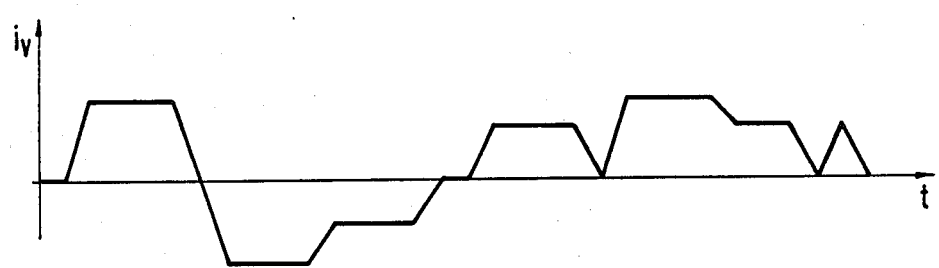
FIG. 1 is a schematic compilation of the possible pulse shapes of the user current.

The possible shapes of the user current pulses $i_V(t)$ required for, for example, the feed of gradient coils are schematically compiled in FIG. 1. Current pulses with and without pause can also follow one another with changing operational sign. Further, changes in amplitude without intervening return of the current to the value zero are possible. In the limiting case, a pulse can also degenerate to a current rise with a decay following immediately thereupon. An additional demand made of the pulse shape may be that all pulses have a constant, prescribable rise or decay time regardless of their current final value. This is already taken into consideration in the illustration in FIG. 1.

In order to build up coil fields having field strength gradients of about 10 mT/m, this variety of possible pulse shapes and the demands made of their reproducibility require a high circuit outlay of the power supply required therefor, especially due to the great range of voltage adjustment thereof and the required rates of current changes as well. Thus, peak currents up to more than 500 A and continuous currents between 300 and 400 A can occur, which must be build up or dismantled in less than one millisecond. The possible durations of the current pulses are in the range between 2 and 100 ms and the allowable deviation from the rated curve thereof is less than 0.4%.

The power supply of the present invention meets the above specifications with justifiable circuit outlay and shall be set forth in greater detail below with reference to FIGS. 2 through 4.

Figure 2:
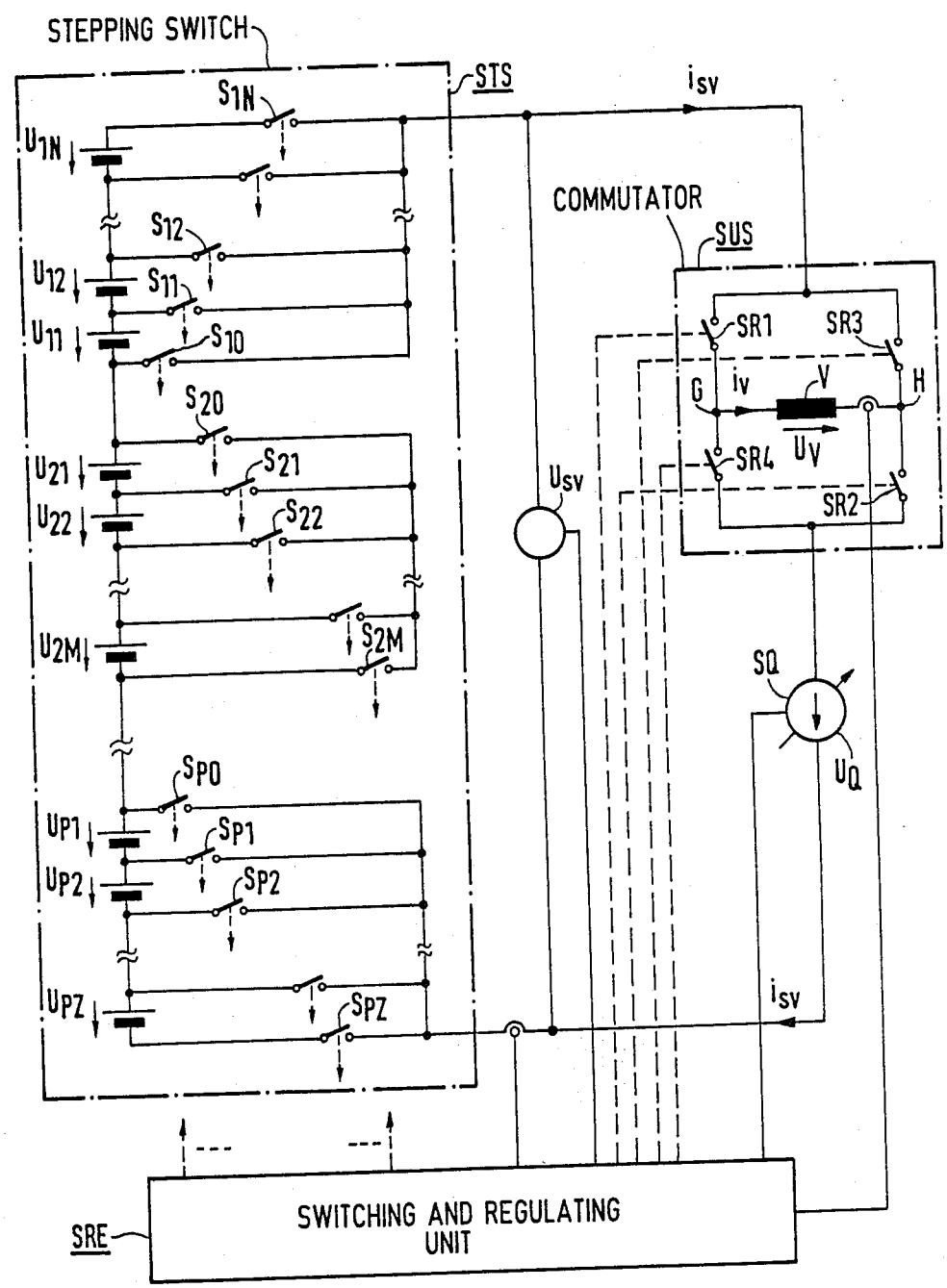
FIG. 2 is a fundamental circuit diagram of the apparatus of the invention.

A "stepping switch" STS and a variable voltage source SQ, as shown in the fundamental circuit diagram of FIG. 2, achieve fast and low-loss adjustment of the voltage $U_V$ at the inductive user V required for the build-up, maintenance and dismantling of the desired current pulse $i_V(t)$. The stepping switch STS is preferably composed of groups of voltage sources $U_{11} \ldots U_{1N}$, $U_{21} \ldots U_{2M}$ through $U_{P1} \ldots S_{PZ}$, arranged in series, the output voltages of all sources of each group having the same value. A switch network connected thereto, composed of the switch groups $S_{10} \ldots S_{1N}$, $S_{20} \ldots S_{2M}$ through $S_{PO} \ldots S_{PZ}$, is driven by a switch and regulating means SRE such that the user voltage $U_V$ required for the build-up/dismantling or maintenance of the respective user current pulse is an precisely preset as possible by the series connection of a suitable combination of voltage sources. For the fine setting of the exact amount of the user voltage $U_V$, the variable voltage source SQ is likewise driven by the switch and regulating means dependent on the output voltage $U_{SV}$ of the stepping switch STS. The desired user voltage can not only be set very fast and exactly, but also the occurring losses, particularly in the variable voltage source, are minimal due to the relatively small range of voltage adjustment therein. Contrary to the known embodiments in the form of switched power packs or bridge circuits having linear controllers which continuously influence the entire range of voltage adjustment, the inventive setting of the user voltage $U_V$ driving the coil current $U_V$ allows a feed to inductive users which is particularly low in upper harmonics and losses. Voltage sources can be connected to or disconnected from the stepping switch as needed without interruption.

The driving user voltage now has to be applied to the user V merely with the suitable operational sign in order to build up or in turn dismantle a current pulses having the desired operational sign. This is accomplished by a voltage commutator SUS shown in FIG. 2 preferably composed of four switches SR1 through SR4 arranged in the form of a bridge. The user is connected in the shunt arms between the junctions G and H. By actuating the switches SR1 and SR2 or SR3 and SR4 impairs via the control and regulating means, the user voltage is supplied to the user such that the actual value of the user current $i_V$ acquired via a measuring element follows a desired rate curve $i_V^*(t)$.

This inventive structure of the power supply has the advantage that the voltage sources of the stepping switch can be used for the feed of further, preferably identically constructed power supplies. In nuclear magnetic resonance tomography, the three power supplies required for building up the three gradient fields for all spatial directions constitute a single set of voltage sources arranged in groups in series.

The voltage values of the sources of the individual groups and, thus, the overall number of voltage sources in the stepping switch, is selected as needed in view of the value of the user voltage maximally required at the inductive user and, for example, in order to achieve an optimally minimum step height or an optimum number of sources. It is especially advantageous when the values of the output voltages of the groups of sources are graduated relative to one another such that the voltage value of a group following in the series connection corresponds to the sum of all voltage values of the preceding group increased by one. The maximum range of adjustment of the variable voltage source SQ preferably corresponds to the voltage value of one of the sources of a group, or is minimally offset relative thereto in order to achieve an overall range of adjustment free of discontinuities. Preferably this range of adjustment just corresponds to the voltage value of that group having the smallest amount of all groups.

A preferred switch and regulating means for operating the inventive power supply of FIG. 2 is composed of a line model SM, an analog-to-digital converter AD, a decoder DE, and a voltage control UR. These elements, among others, are shown in FIG. 4. The rated curve of a desired current pulse is prescribed to the line model in the form of the signals $i_V^*(t)$ and the derivative $di_V^*(t)/dt$ thereof, this model identifying the voltage $U_V^*$ at the user V required for driving the pulse in accord with the equation $$U_V^* = R_V \cdot i_V^*(t) + L_V \cdot \frac{di_V^*(t)}{dt}.$$

This represents the known relationship between voltage and current at a real coil having an inductance $L_V$ and an ohmic resistance $R_V$. The rated value of user voltage thus identified is set by selection of the stepping switch STS and the voltage commutator SUS via the decoder DE supplied by the analog-to-digital converter AD, and by selection of the variable voltage source SQ via the voltage control UR. To this end, the rated value is converted into a binary number BZ in the analog-to-digital converter AD. Via the decoder DE, the corresponding switches of the switch network in the stepping switch and the corresponding switch pairs in the voltage commutator are selected with the assistance of this binary number BZ. Given suitable coding of the binary number and a plurality and graduation of the voltage sources in the stepping switch adapted thereto, the switches of the switch network and their switch statusses can be almost immediately allocated to the individual places of the binary number. Preferably the lowest significance of this binary number corresponds to the lowest voltage prescribable by the stepping switch, and the latter in turn corresponds to the maximum voltage $U_Q$ prescribable via the variable voltage source SQ. It is also possible to represent the rated voltage value $U_V^*$ as a number of an arbitrary numerical system. Finally, for the fine setting of the exact value of the user voltage, the rated value $U_Q^*$ for the voltage control UR is formed by subtracting the output voltage $U_{SV}$ of the stepping switch from the amount $|U_V^*|$ of the rated value of the user voltage formed via the element BB, this voltage control UR driving the variable voltage source SQ in accord with its actuating signal repetitive error.

Figure 3:
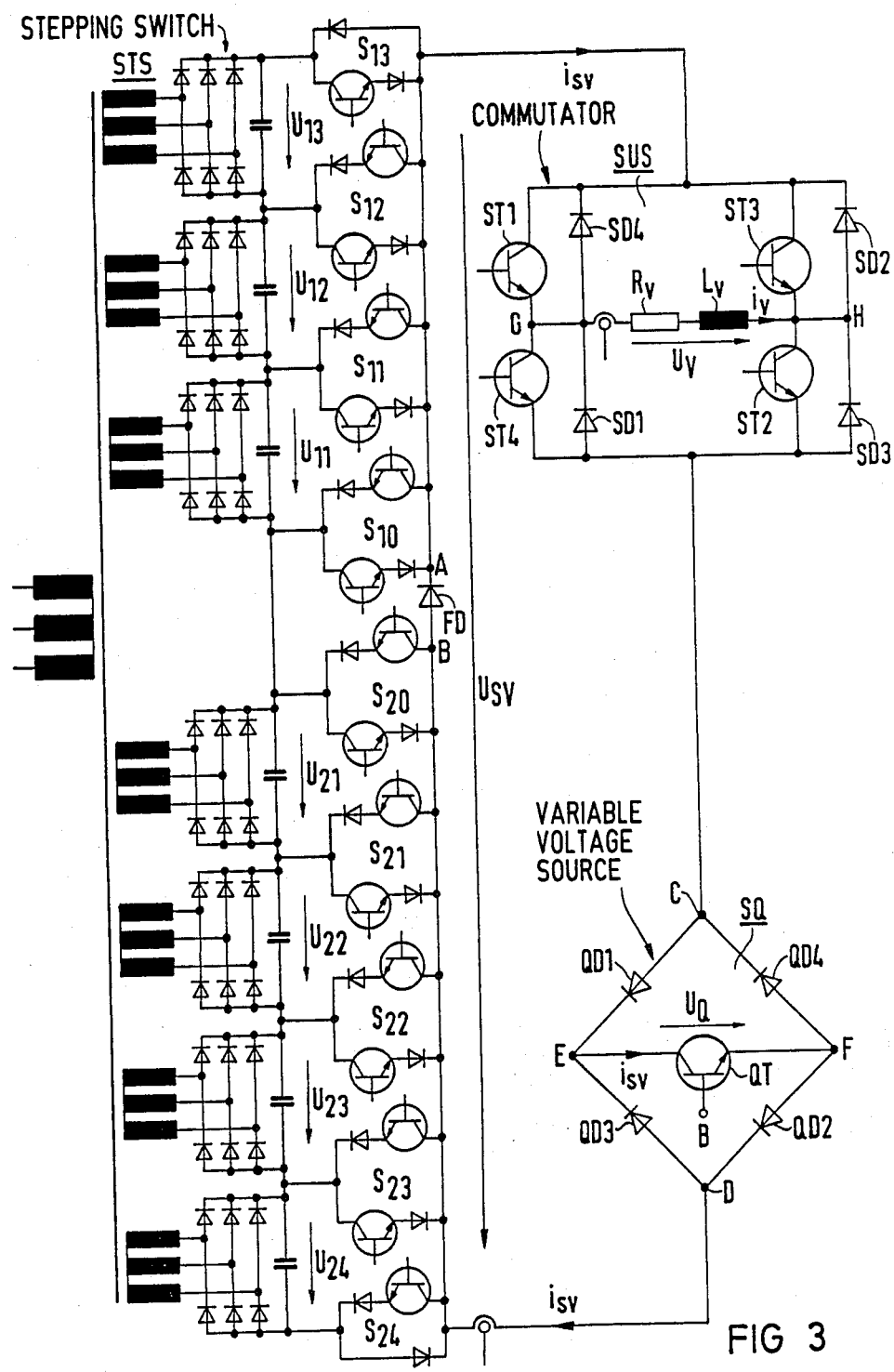
FIG. 3 is a preferred exemplary embodiment of the apparatus of the invention.
Figure 4:
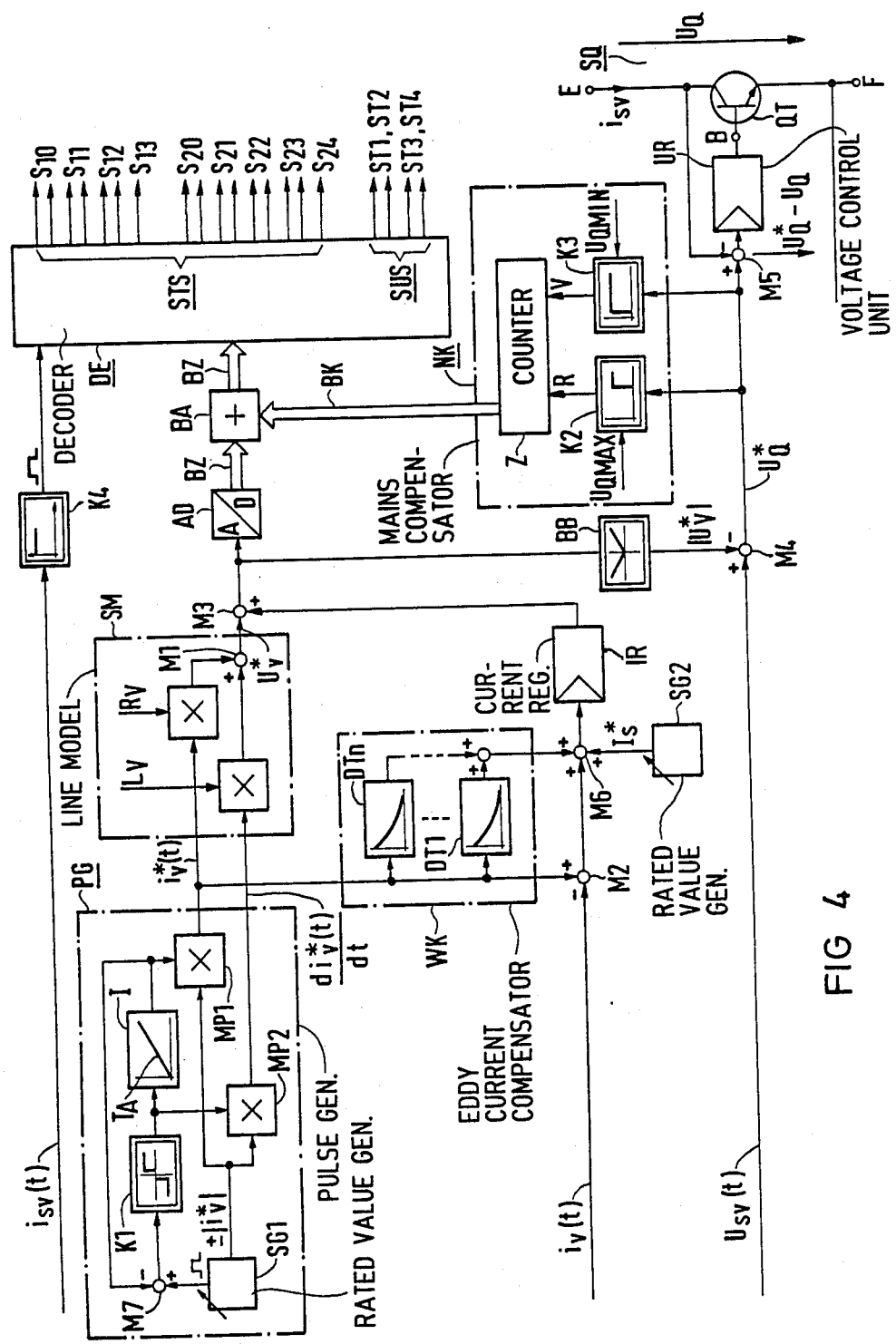
FIG. 4 is an especially appropriate embodiment of the switch and regulating means of the invention.

FIG. 3 shows an exemplary embodiment of the inventive power supply of FIG. 2. Two groups each having three or identical voltage sources $U_{11} \ldots U_{13}$ or $U_{21} \ldots U_{24}$ are present in the stepping switch STS, these voltage sources potentially having, for example, the voltage values 20 V and 80 V. The voltages sources themselves correspond to the secondary windings of a three-phase rectifier and a supporting capacitor. The switches of the stepping switch each have series branches of opposite polarity, each branch having a switching transistor and a series diode for protection against negative collector-emitter voltages that is arranged in collector-emitter current flow direction. This has the advantage that, given connection of a further voltage source, for example within a group, the current $i_{SV}$ immediately commutes to the transistor of the switch associated therewith, whereas the previously current-conducting transistor is decoupled via its series diode. Finally, it is to connect a protective diode FD in its non-conducting direction at the output of the stepping switch opposite the voltage $U_{SV}$, to avoid inadmissably high voltages in case of malfunction. In the examplary embodiment of FIG. 3, this is connected to the junctions A and B. It also serves as a free-running element when a current path is not present in the stepping switch itself.

In accord with FIG. 3, the variable voltage source SQ is composed of a power transistor QT operated as a linear regulator whose output voltage $U_Q$ is continuously set via the voltage control loop with the voltage control UR dependent on the collector-emitter voltage $U_Q$. This linear regulator is arranged in the shunt arm comprising the corner points E and F of a diode bridge composed of the four diodes QD1 through QD4, so that a current $i_{SV}$ in both directions is possible. Upon application of Kirchhoff's second law, the user voltage $U_V$ derives from the voltage of the stepping switch $U_{SV}$ and the variable voltage source $U_Q$ dependent on the present direction of the current $i_{SV}$. The voltage commutator SUS, whose four switches are preferably composed of switching transistors ST1 through ST4 each having an opposite polarity, free-running diode in parallel therewith, supplies the user voltage $U_V$ with an appropriate operational sign to the user. The user is shown composed of an equivalent resistance $R_V$ and an equivalent inductance $L_V$.

It is particularly advantageous to expand the control and regulating means SRE by further components. These may be a pulse generator PG, a user current regulator IR, respective means for eddy current compensation WK and mains compensation NK, and an additional rated value generator SG2. These elements shall be set forth in greater detail below with reference to FIG. 4.

The inventive pulse generator PG enables the prescription of exactly defined user current pulses $i_V^*(t)$. To this end, a rated value generator SG1 prescribes the desired rise and decay points in time via a square logic signal and prescribes the desired final values $|i_V^*(t)|$ of the individual pulses. Via a mixing location M7, the square signal controls a standarized starting generator which is composed of an integrator I with negative feedback and having variable integration time $T_A$, which is driven by a comparator K1. The standardized output signal of the integrator I is weighted with the momentary final value in a multiplier MP1, so that current pulses are obtained having a rise or decay time independent of the final value. For drive of the line model SM, it is preferable to additionally weight the signal at the input of the integrator with the final value via a second multiplier and to supply it for further multiplication with the load inductance $L_V$.

For elimination of potential imprecisions of the line model SM, the output signal $U_V^*$ thereof may have a correction signal locked onto it at the mixing location M3. An additional user current regulator IR forms this correction value from the actuating signal between the actual and rated value of user current.

A further means forms a further correction signal from the rated curve $i_V^*(t)$ of the user current and locks this further correction signal onto the actuating signal at the input of the user current regulator IR. This means WK provided for the compensation of eddy currents takes the attenuation influence of eddy currents into consideration, these occurring given the fast modification of high magnetic fields. In accord with the plurality of time constants of the eddy currents to be compensated, transfer elements DT1...DTn having differentiating-delaying behavior are connected in parallel. Their output signals are summed and are locked to the actuating signal in an additional mixing location M6 at the input of the regulator IR.

For homogenization of the magnetic field inside large coils, small correction coils called shim coils are often additionally attached from the exterior. They can be eliminated when their influence on the magnetic field is taken into consideration using what is referred to as a "shim rated value" formed by a further rated value generator SG2. This is likewise perferably locked onto the input of the user current regulator IR at the mixing location M6.

Finally, sudden fluctuations in line voltage can lead to considerable modifications of the voltage values of the sources of the stepping switch STS. In such a case, rated values $U_Q^*$ can arise at the input of the voltage control UR which would lead to an upward or downward transgression of the possible range of adjustment of the variable voltage source SQ. Given upward or downward transgression of the maximum or minimum values $U_{QMAX}$ or $U_{QMIN}$ of the rated value $U_Q^*$, it is thus preferable to decrement or increment a counter Z. In an adder BA, the binary number BZ is increased by the output signal of the counter Z, so that, for example given a fad of the line voltage, additional voltage sources of the stepping switch are added, insofar as available, for supporting the output voltage $U_{SV}$, or are disconnected given line overvoltages.

Given switches of the stepping switch STS that are executed as opposite polarity, parallel connections of transistors in accord with FIG. 3, the decorder DE has the additional job of driving the respective transistor of the corresponding switch which is in the current flow direction in accord with the momentary operational sign of the current $i_{SV}(t)$. In accord with FIG. 4, the operational sign of the current $i_{SV}$ is acquired via a comparator K4 for this purpose, and one of the two signals leading from the decoder output to every switch $S_{10}...S_{24}$ of FIG. 3 is activated.

Although modifications and changes may be suggested by those skilled in the art it is the invention of the inventor to embody within the patent warranted hereon all changes and modifications as reasonably and properly come within the scope of their contribution to the art.

I claim as my invention:

1. A power supply for generating brief current pulses with high edge steepness and a high final value for inductive users, which generates a high user voltage for rapid build-up of the pulse and a low user voltage for maintenance of said pulse, said power supply comprising:
    a stepping switch which presets the magnitude of said user voltage;
    a variable voltage source connected in series with said stepping switch and with said user which allows fine adjustment of the magnitude of said user voltage;
    a voltage commutator connected to said user and being connected in series with said stepping switch and said variable voltage source which provides said user voltage with an appropriate operational sign for respectively rapidly building-up said pulse or dismantling said pulse; and
    a switching and regulating means for driving said stepping switch, said variable voltage source and said voltage commutator dependent on the final value, the edge steepness, and the operational sign of said pulses.

2. A power supply as claimed in claim 1, wherein said stepping switch consists of a plurality of groups of identical voltage sources connected in series, and a switching network connected to said stepping switch.

3. A power supply as claimed in claim 1, wherein said user has a load resistance $R_V$ and a load inductance $L_V$, wherein said pulse has a prescribed form $i_V^*(t)$, and wherein said switching and regulating means comprises:
    a line model of said inductive user which exerts anticipatory control on a rated value $U_V^*$ of said voltage in accordance with the equation $$U_V^* = R_V \cdot i_V^*(t) + L_V \cdot \frac{di_V^*(t)}{dt};$$

an analog-to-digital converter which converts said rated value of the user voltage $U_V^*$ into a binary number;
    a decoder which drives said stepping switch in accordance with the value of said binary number to preset said user voltage, and drives said voltage commutator in accordance with the operational sign of said binary number for setting the operational sign of said user voltage; and
    a voltage control means for driving said variable voltage source dependent on the difference between the output voltage of said stepping switch and the magnitude of the rated value of said user voltage and dependent on the deviation of said difference from the actual output voltage of said variable voltage source.

4. A power supply as claimed in claim 3, further comprising a user current regulator means for forming a correction signal out of the deviation of an actual current value from a rated user current value, and for locking said correctional signal on said rated value of said user voltage.

5. A power supply as claimed in claim 4, further comprising a pulse generator including a rated value generator which selects a final value $i_V^*$ for said pulse and for selecting rise and decay points in time of said pulse, said pulse generator means further including a standarized starting generator being connected to the output of said rated value generator and having a variable integration time including an integrator operated by a comparator, the output of said integrator being negatively fed back to the input of said comparator, said integration time beginning at every pulse rise or decay point in time, said pulse generator further including means for multiplying the integrator input and output values by said selected final value, thereby generating a current pulse of said prescribed form $i_\nu{}^*(t)$ and the derivation thereof.

6. A power supply as claimed in claim 5, further comprising means for eddy current compensation including a plurality of parallel transfer elements having differentiating-delaying behavior, the number of said parallel transfer elements being dependent on the number of the selected eddy current time constants to be compensated, said transfer elements locking a signal dependent on said current pulse $i_\nu{}^*(t)$ on the input of said current regulator means.

7. A power supply as claimed in claim 3, further comprising means for mains compensation including a binary counter which is respectively incremented or decremented dependent upon an upward or downward transgression of a selected maximum or minimum value of the rated value of said voltage control unit, and the output of said binary counter being added to said binary number.

8. A power supply as claimed in claim 4, further comprising a second rated value generator which simulates the influence of shim coils attachable to said inductive user, the output of said second rated value generator being locked onto the input signal of the current regulator means.

9. A power supply as claimed in claim 1, wherein said voltage commutator consists of four switches connected in a bridge, said bridge having a shunt arm in which said inductive user is connected.

10. A power supply as claimed in claim 9, wherein each of said four switches of said voltage commutator consists of a switching transistor having an opposite polarity, free-running diode connected in parallel therewith.

11. A power supply as claimed in claim 2, wherein each of said groups of identical voltage sources of said stepping switch having a voltage value being graduated with respect to the voltage value of the voltage sources in an other group, said groups being connected in sequence for supplying progressively larger voltages, with the voltage value of every source in a group corresponding to the sum of the voltage values of all sources in an immediately preceding group plus the voltage value of one source of said immediately preceding group.

12. A power supply as claimed in claim 3, wherein said binary number has a lowest significance which corresponds to the lowest voltage value prescribable by said stepping switch.

13. A power supply as claimed in claim 1, wherein said variable voltage source has a maximum voltage which corresponds to the lowest voltage prescribable by said stepping switch.

14. A power supply as claimed in claim 1, wherein said variable voltage source consists of a diode bridge having a shunt arm, and a transistor having a linearly modulatable collector-emitter voltage connected in said shunt arm.

15. A power supply as claimed in claim 1, wherein said stepping switch has a plurality of switches, each switch consisting of two branches, each branch consisting of a transistor with a diode connected in series with the collector-emitter direction of the transistor in the branch therewith, the transistors in the branches comprising a switch being connected with opposite polarity.

16. A power supply as claimed in claim 1, wherein said stepping switch has an output and further comprising a protective diode connected at said output of said stepping switch in a high-resistance direction.

* * * * *